United States Patent
Shishido et al.

(10) Patent No.: US 6,846,521 B2
(45) Date of Patent: Jan. 25, 2005

(54) APPARATUS AND METHOD FOR FORMING DEPOSITED FILM

(75) Inventors: Takeshi Shishido, Kyoto (JP); Masahiro Kanai, Tokyo (JP); Yuzo Koda, Kyoto (JP); Takahiro Yajima, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/650,763

(22) Filed: Aug. 29, 2003

(65) Prior Publication Data

US 2004/0035361 A1 Feb. 26, 2004

Related U.S. Application Data

(62) Division of application No. 09/767,856, filed on Jan. 24, 2001, now Pat. No. 6,632,284.

(30) Foreign Application Priority Data

Jan. 31, 2000 (JP) ........................................ 2000-023022

(51) Int. Cl.[7] .............................................. C23C 16/00
(52) U.S. Cl. ..................... 427/569; 427/579; 427/248.1
(58) Field of Search ................................. 427/569, 579, 427/248.1, 580

(56) References Cited

U.S. PATENT DOCUMENTS

| | | | |
|---|---|---|---|
| 3,863,087 A | 1/1975 | Holz | 313/585 |
| 4,800,174 A | 1/1989 | Ishihara et al. | 437/101 |
| 5,589,007 A | 12/1996 | Fujioka et al. | 136/249 |
| 5,672,208 A | 9/1997 | Morita | 118/723 E |
| 5,900,284 A | 5/1999 | Hu | 427/489 |

FOREIGN PATENT DOCUMENTS

| | | |
|---|---|---|
| JP | 1-103828 | 4/1989 |
| JP | 5-56850 | 8/1993 |

*Primary Examiner*—Timothy Meeks
(74) *Attorney, Agent, or Firm*—Fitzpatrick, Cella, Harper & Scinto

(57) ABSTRACT

A two-layer structured electric power application electrode including a non-split electrode consisting of a single planar plate and six split electrodes arranged on the non-split electrode so as to be electrically in contact with the non-split electrode is arranged on the upper side of a discharge chamber provided within a vacuum container such that the power application electrode faces a strip substrate in parallel. The split electrodes are arranged in such a manner as to form a planar plane, and the distance between the surfaces of the split electrodes facing the strip substrate and the strip substrate is uniform. The total area of the surfaces of the split electrodes facing the strip substrate is the same as the area of the non-split electrode on which the split electrodes are mounted. This improves the uniformity in plasma generated in the apparatus for forming a deposited film and enables cutting-down of the costs required to form deposited films.

6 Claims, 4 Drawing Sheets

APPARATUS AND METHOD FOR FORMING DEPOSITED FILM

This application is a division of Application No. 09/767,856, filed Jan. 24, 2001 now U.S. Pat. No. 6,632,284.

BACKGROUND OF THE INVENTION

1. Field of the Invention

The present invention relates to an apparatus for forming a deposited film in which plasma is generated between an electrical power application electrode and a substrate functioning as an electrode arranged opposite to the electrical power application electrode in a vacuum container and a reactive gas introduced into the vacuum container is decomposed to form a deposited film on the substrate.

2. Related Background Art

One of the typical examples of the clean energy sources may be a solar cell. The solar cell is an electronic device which utilizes the photovoltaic effect of converting light energy such as solar energy into electrical energy, and it has lately attracted considerable attention as a part of preventive measures taken in the future against energy problems.

Amorphous silicon has lately attracted notice as a material which can realize a lower-cost solar cell. Amorphous semiconductors, such as amorphous silicon, have occupied attention as materials for use in various types devices, because they can be formed into thin films and be made large in area, their compositional degree of freedom is high, and because their electrical and optical properties can be controlled over a wide range. For amorphous silicon, its optical absorption coefficient is large, compared with silicon crystal, particularly for the light in the vicinity of the peak of solar energy distribution and its film forming temperature is low. Further it has characteristics such that its deposited films can be formed directly from a raw material by using glow discharge and junction formation is easily conducted. Although amorphous silicon has such characteristics as described above and, as for the performance, amorphous silicon having a high conversion factor has already been obtained, it has been desired that its costs should be further reduced. One of the obstacles of realizing lower-cost amorphous silicon may be that its film forming rate in the manufacturing process is low.

In a p-i-n amorphous silicon solar cell produced by the glow-discharge gas decomposition method, a deposited film has been formed in the direction of the film thickness of an i-type semiconductor layer at a fixed film forming rate, for example, at a low rate of 0.1 to 2 Å/sec; therefore, it has taken about 30 minutes to 2 hours to complete the formation of an i-type semiconductor film 4000 Å thick. As one example of the methods of performing high-rate film formation, an attempt has been made to perform film formation utilizing 100% $SiH_4$ gas or 100% $Si_2B_6$ gas at a high rate of 5 to 100 Å/sec. Further, in Japanese Patent Publication No. 5-56850, there is disclosed a method in which a film forming rate is increased by decreasing a distance between a power application electrode and a substrate functioning as an electrode.

In the conventional apparatus for forming a deposited film, however, the deformation of the power application electrode may sometimes make it difficult to form a uniform deposited film. Specifically, in order to improve the optical and electrical properties of the deposited film to be formed, the members within the electric discharge chamber need to be heated to a desired temperature, and moreover, their temperature is further increased due to the collision of the particles, such as electrons and ions, accelerated by plasma discharge against the members within the electric discharge chamber. Furthermore, the deposited film is formed on portions other than the substrate, for example, on the power application electrode. As a result, the thermal expansion due to the thermal energy and the stress due to the formation of the deposited film cause deformation of the power application electrode, and hence, generation of non-uniform plasma. This may sometimes make it difficult to form a uniform deposited film.

In Japanese Patent Publication No. 5-73327, there is disclosed an apparatus in which an electric power application electrode is split into a plurality of electrodes and the split electrodes are largely spaced at a large distance and electrically connected to a connection member which allows the distance between adjacent electrodes to be variable. A similar deformation is caused in the substrate, and however the deformation of the substrate can be kept slight by taking preventive measures of, for example, fixing the substrate fast to a substrate holder, or when the substrate is in a strip form, drawing it with a magnet or applying a strong tension to it.

However, when electrically connecting adjacent split electrodes with a connection member, as disclosed in Japanese Patent Publication No. 5-73327, the thickness of the connection plate and the bolts used for connecting the connection plate to the split electrodes affect the distance between the electrode and the substrate as projections, which may cause a disturbance in plasma at such projection-like portions. Furthermore, it is difficult to arrange a plurality of split electrodes in a planar state in one plane simply by connecting the split electrodes with a connection plate, and the decrease of the planeness of split electrodes, in particular in cases where the distance between the electrode and the substrate is small, causes non-uniformity in plasma, which may sometimes give rise to variation in a film forming rate depending on a position on the substrate.

Furthermore, as described above, in the conventional apparatus for forming a deposited film, deposited films are inevitably formed on portions other than the substrate which is an intended portion, such as the power application electrode, because of their configuration. The films formed on the portions other than the substrate which is an intended portion tend to peel, and the films having peeled become the cause of contamination and dust in the subsequent film formation. In order to prevent the quality degradation of the film formed on the substrate due to such contamination and dust, the deposited films formed on the portions other than the substrate need to be removed every time the substrate is replaced, in addition, the power application electrode also needs to be replaced at periodic intervals. This has prevented the continuous production of deposited films and may sometimes prevent the improvement in mass production of the same. In particular, at the time of forming a deposited film with a large area, since the power application electrode becomes large, it takes a lot of time to do such operations as replacing and cleaning the power application electrode frequently, which has been one of the causes of high production costs.

SUMMARY OF THE INVENTION

An object of the present invention is to provide an apparatus and method for forming a deposited film which enable the generation of uniform plasma required for uniform formation of a deposited film and also enable the cut-down of costs required for formation of the deposited film.

In order to attain the above object, the present invention provides an apparatus for forming a deposited film, comprising a vacuum container containing a pair of electrodes consisting of an electric power application electrode to which electric power is applied and a substrate on which the deposited film is to be formed, in which the deposited film is formed on the substrate by generating plasma between the substrate and the power application electrode to decompose a gas, as a raw material for the deposited film, introduced into the vacuum container, wherein the power application electrode is consisted of a single planar electrode and a plurality of split electrodes electrically connected to the planar electrode and each having an area smaller than that of the plane of the planar electrode, and the plurality of split electrodes are arranged on the substrate-facing side of the planar electrode in such a manner as to form at least one substantially planar electrode layer having almost the same shape as that of the plane of the planar electrode.

Further, the present invention provides a method of forming a deposited film, comprising forming a deposited film on a substrate in a vacuum container containing a pair of electrodes consisting of an electric power application electrode to which electric power is applied and the substrate on which the deposited film is to be formed by generating plasma between the substrate and the power application electrode to decompose a gas, as a raw material for the deposited film, introduced into the vacuum container, wherein the power application electrode is consisted of a single planar electrode and a plurality of split electrodes electrically connected to the planar electrode and each having an area smaller than that of the plane of the planar electrode, and the plurality of split electrodes are arranged on the substrate-facing side of the planar electrode in such a manner as to form at least one substantially planar electrode layer having almost the same shape as that of the plane of the planar electrode.

In the apparatus or method for forming a deposited film according to the present invention, preferably a part of the plurality of split electrodes is directly contacted with the planar electrode. And preferably, the plurality of split electrodes are arranged on the substrate-facing side of the planar electrode in such a manner as to form a plurality of substantially planar electrode layers. Further, preferably, each of the areas of the split electrodes is equal to one another, or preferably the areas of the split electrodes differ depending on the electrode layer. Preferably, the areas of the split electrodes forming each electrode layer become larger so that the electrode layers becomes closer to the planar electrode.

In the apparatus and method for forming a deposited film according to the present invention which are constructed in the above-described manner, a plurality of small-sized planar electrodes, that is, split electrodes are arranged on a single planar electrode in such a manner as to face a substrate. Therefore, even if the small-sized electrodes are deformed by heat of a heater or plasma or by stress caused by the deposited film formed on the surface of small-sized planar electrodes (split electrodes), the deformation per small-sized planar electrode is small compared with that of the power application electrode consisting of a single plate not split. Thus, the planeness of the entire electrode layer formed by arranging small-sized planar electrodes (split electrodes) is increased to result in stabilizing the distance between the power application electrode and the substrate, whereby non-uniformity in plasma due to the variation in distance between the electrodes can be controlled.

Further, since the small-sized planar electrodes (split electrodes) are small in size and light in weight compared with the power application electrode consisting of a single non-split plate, the maintenance such as replacement of the small-sized planar electrodes can be performed easily.

Each small-sized planar electrode is arranged in such a manner as to be in direct contact with the planar electrode.

Further, the power application electrode may include a plurality of split electrodes as intermediate planar electrodes provided between the planar electrode and the split electrodes as small-sized planar electrodes, the intermediate planar electrodes being arranged in such a manner as to form a substantially planar plane having almost the same shape as the plane of the planar electrode and electrically connect the planar electrode and the small-sized planar electrodes, and each of the intermediate planar electrodes having an area smaller than that of the plane of the planar electrode. In this case, because of the existence of a plurality of split electrodes as intermediate planar electrodes between the planar electrode and the split electrodes as small-sized planar electrodes, the small-sized planar electrodes (split electrodes) are subjected to less heat loading, whereby the deformation of the small-sized planar electrodes is further inhibited.

The power application electrode may include a plurality of electrode layers which are consisted of split electrodes as intermediate planar electrodes such that the electrode layers are formed by stacking the planar planes consisting of the intermediate planar electrodes. In this case, the small-sized planar electrodes are subjected to much less heat loading.

The areas of the split electrodes as intermediate planar electrodes forming a plurality of electrode layers may be larger than those of the split electrodes as small-sized planar electrodes, and the areas of the split electrode as intermediate planar electrodes forming a plurality of electrode layers may become larger layer by layer from the small-sized planar electrode layer toward the planar electrode. In this case, the decrease in conductivity between the planar electrode and each small-sized planar electrode can be inhibited because the areas of the intermediate planar electrodes are made larger than those of the small-sized planar electrodes, whereby the electric power applied to the planar electrode can be uniformly supplied to each small-sized planar electrode.

The area of each split electrode as an intermediate planar electrode may be substantially equal to the area of each split electrode as an small-sized planar electrode.

DETAILED DESCRIPTION OF THE PREFERRED EMBODIMENTS

In the following, embodiments of the present invention will be described with reference to the accompanied drawings.

(First Embodiment)

Figure 1:
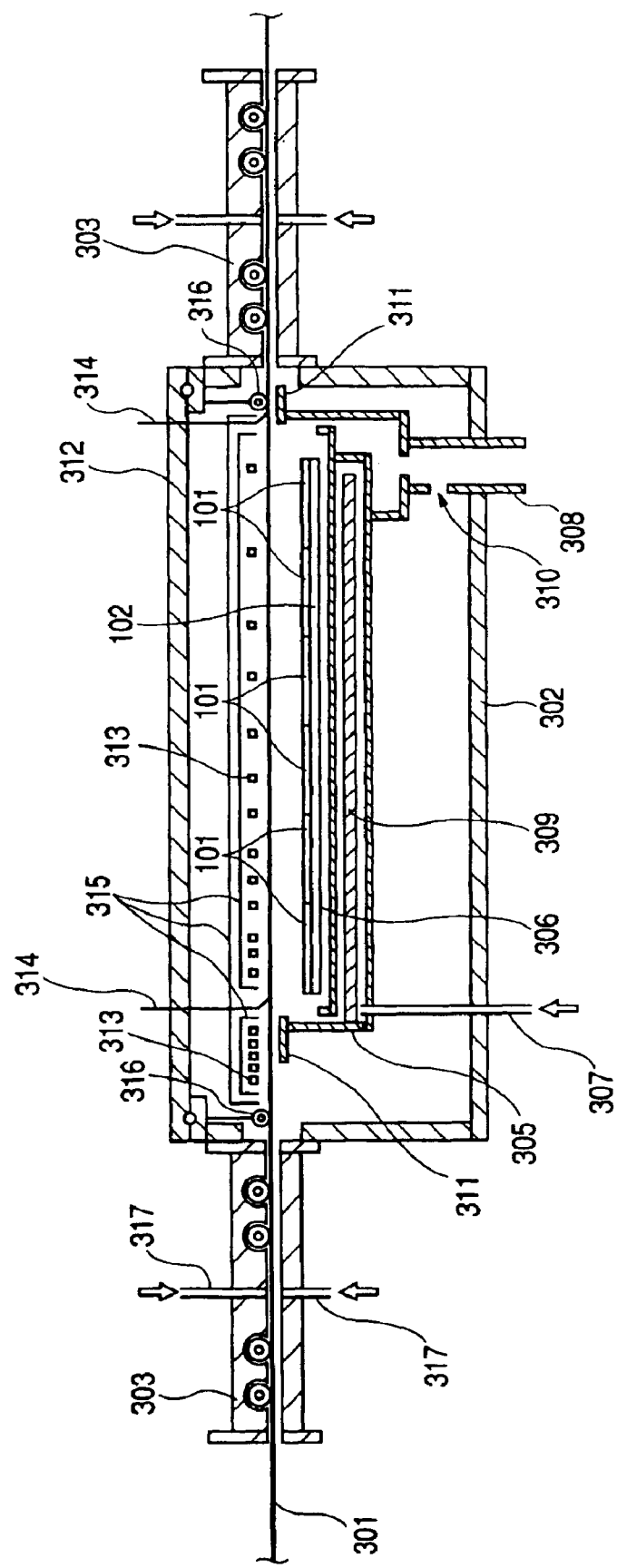
FIG. 1 is a schematic sectional side view of one example of the apparatus for forming a deposited film according to the first embodiment of the present invention.
Figure 2:
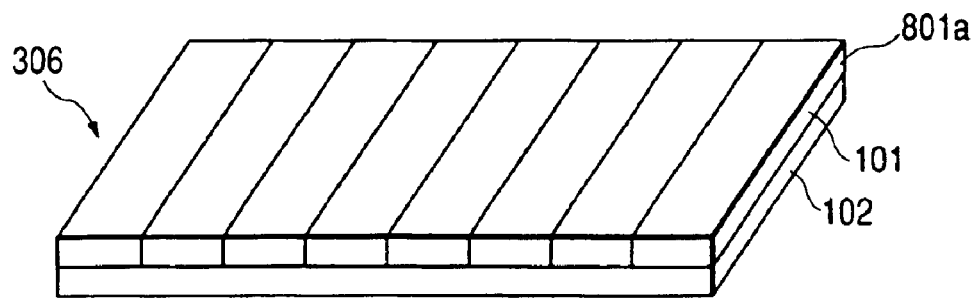
FIG. 2 is a schematic perspective view of the power application electrode of the deposited-film forming apparatus shown in FIG. 1.

FIG. 1 shows a schematic sectional side view of one example of apparatus for forming a deposited film according to this embodiment, and FIG. 2 shows a schematic perspective view of the power application electrode of the apparatus for forming a deposited film according to this embodiment.

The apparatus for forming a deposited film according to this embodiment is that of parallel plate capacitance coupled type. The apparatus for forming a deposited film includes, in a vacuum container 302, a discharge chamber 305 having a block heater 309 therein, a film forming region opening regulating plate 311 for regulating the area of a deposited film formed on a strip substrate 301, an electric power application electrode 306 to which electric power (not shown in the drawings) supplied from a power supply provided outside is applied, and a group of lamp heaters 313 provided with a reflector 315 for generating radiant heat for heating the strip substrate 301.

The vacuum container 302 has openings formed on both its sidewalls, wherein the opening is communicated with a gas gate 303 which is provided with a gate gas introducing pipe 317 for introducing a gate gas to maintain the internal pressure of the vacuum container 302. The strip substrate 301 passes through the gas gate 303 and is conveyed to the inside of the vacuum container 302 while being supported by a supporting roller 316. An exhaust pipe 308 is provided on the bottom wall of the vacuum container 302, the exhaust pipe being in communication with an exhaust apparatus such as a vacuum pump (not shown in the drawings) for reducing the internal pressure of the vacuum container 302 to a desired vacuum pressure. The exhaust pipe 308 has a discharge chamber outside exhaust opening 310 formed thereon for exhausting the vacuum container 302 except for the discharge chamber 305. A lid 312 is provided with a thermocouple 314 for measuring the internal temperature of the vacuum container 302. The vacuum container 302 is connected in series to another vacuum container not shown in the drawings.

The discharge chamber 305 has a hollow rectangular structure with an opening formed on the upper side thereof and facing the strip substrate 301. The block heater 309 arranged inside the discharge chamber 305 is for heating raw material gases introduced from a raw material gas introducing pipe 307.

The power application electrode 306 has a two-layer structure including a planar electrode (non-split electrode) 102 consisting of a single planar plate and split electrodes 101 arranged on the non-split electrode 102 in such a manner as to electrically come into contact with the non-split electrode 102, as shown in FIG. 2. Each of the split electrodes 101 faces the strip substrate 301 in parallel, and the split electrodes 101 are arranged in such a manner as to allow their surfaces facing the strip substrate 301 to form a single planar plane. In other words, the split electrodes 101 and the strip substrate 301 are constructed in such a manner that the distance between the surface of each split electrode 101 facing the strip substrate 301 and the strip substrate 301 are uniform. And the total area of the surfaces of the split electrodes 101 facing the strip substrate 301 is substantially equal to the area of the surface of the non-split electrode 102 on which the split electrodes 101 are mounted. The materials of the power application electrode 306 are preferably aluminum, iron and stainless steel having a small electric resistance. It is to be understood that in the present embodiment the number of split electrodes 101, the direction of splitting, and the shape of each split electrode 101 are not intended to be limited to those shown in FIG. 2. Reference numeral 801a denotes an electrode layer.

The distance between the surface of each split electrode 101 facing the strip substrate 301 and the strip substrate 301 is preferably 50 mm or less so as to increase the film forming rate, and more preferably 10 mm or more and 30 mm or less. The power application electrode 306 is electrically connected to one terminal of a power supply via a matching box not shown in the drawings, so that electric power of low-frequency in the range of 5 kHz to 500 kHz, high frequency in the range of 500 kHz to 30 MHZ or VHF in the range of 30 MHZ to 500 MHZ is applied to the planar electrode (non-split electrode) 102. This means that the external electric power is first applied directly to the planar (non-split electrode) electrode 102, and then applied to each split electrode 101 from the non-split electrode 102. The other terminal of the power supply is grounded.

The strip substrate 301 is an elongated substrate in a strip form wound around a drum not shown in the drawings and consists of a flexible insulator, such as a high polymer film, having a conductive thin film formed thereon. A flexible conductive substrate such as stainless steel may be used as the strip substrate 301. Instead of the strip substrate as described above, a light-transmissive insulator such as a glass substrate and a non-light-transmissive conductor such as a stainless steel substrate both of which are mounted on a substrate support may be used. This strip substrate 301, in combination with the power application electrode 306, constitutes a pair of electrodes for generating plasma as described later.

The raw material gases introduced through the raw material gas introducing pipe 307 are material gases for forming semiconductors, such as $SiH_4$ and $Si_2H_6$, and $H_2$ and He, and they can be used to form a silicon-based non-single-crystalline deposited film such as amorphous, microcrystalline and polycrystalline deposited films when decomposed by plasma.

In the following, the outline of the procedure for forming a deposited film using an apparatus for forming a deposited film according to the present embodiment will be described.

First, the vacuum container 302 is exhausted with an exhaust apparatus. Then raw material gases are introduced through the raw material gas introducing pipe 307, and the introduced raw material gases are heated with the block heater 309 while heating the strip substrate 301 with the lamp heater 313. Plasma is generated between the power application electrode 306 and the strip substrate 301 by applying electric power to the power application electrode 306, and the raw material gases are decomposed by the plasma to form a deposited film on the strip substrate 301. As the plasma generated, low-frequency plasma, high-frequency plasma or VHF plasma can be generated by selecting as the electric power applied to the power application electrode 306, for example, low-frequency power in the range of 5 kHz to 500 kHz, high-frequency power in the range of 500 kHz to 30 MHZ or VHF power in the range of 30 MHZ to 500 MHZ.

The power application electrode 306 consists of a non-split electrode 102 and a plurality of split electrodes 101 arranged on the non-split electrode, each of the split electrode 101 having an area smaller than that of the planar electrode (non-split electrode) 102. Therefore, even when the split electrodes 101 are deformed by heat of a heater or plasma or by stress caused by the deposited film formed on the surface of the split electrodes 101, the deformation per split electrode is small compared with that of the power application electrode consisting of a single non-split plate. Thus, the planeness of the entire surface of the power application electrode 306 facing the strip substrate 301 is increased, thereby resulting in stabilization of the distance between the power application electrode 306 and the strip substrate 301. Non-uniformity in plasma due to the variation in distance between the electrodes can thereby be inhibited.

Further, since the split electrodes 101 are small and lightweight compared with the power application electrode consisting of a single non-split plate, the maintenance, such as replacement of the split electrodes 101, can be performed easily.

As described above, according to the apparatus for forming a deposited film of the present embodiment, since the power application electrode 306 is constructed in such a manner as to include a plurality of split electrodes 101, non-uniformity in plasma can be inhibited, and therefore, a deposited film of a desired thickness having a large area can be formed. Furthermore, the improvement in maintainability enables cutting-down of the costs required to form deposited films.

(Second Embodiment)

Figure 3:
FIG. 3 is a schematic perspective view of the power application electrode of the apparatus for forming a deposited film according to the second embodiment of the present invention.

The power application electrode 306*a* for use in an apparatus for forming a deposited film of the present embodiment has a four-layer structure including a planar electrode (non-split electrode) 604 consisting of a single planar plate and a third, a second and a first split electrodes 603, 602 and 601 each of which are split into 8 electrodes and stacked on the planar electrode (non-split electrode) 604 one by one in this order, as shown in FIG. 3. The individual electrodes of each of the first, second and third split electrodes 601, 602 and 603 are all the same in shape, and the surface area of the non-split electrode 604 on which each split electrode is mounted is substantially the same as the total area of the surfaces of the first split electrode 601 facing the strip substrate. It goes without saying that the total area of the surfaces of the first split electrodes 601 facing the strip substrate, the total area of the surfaces of the third split electrodes 603 on which the second split electrodes 602 are mounted, and the total area of the surfaces of the second split electrodes 602 on which the first split electrodes 601 are mounted are all substantially the same. In the present embodiment, one example of the power application electrodes 306*a* has been given which includes split electrodes stacked on the non-split electrode 604 in three layers, in other words, which consists of the non-split electrode 604 holding split electrodes on its upper side surface, the first split electrodes 601 facing the strip substrate 301, and the second and third split electrodes 602 and 603 arranged between the non-split electrode 604 and the first split electrodes 601 in such a manner as to form layers, as shown in FIG. 3. However, it is to be understood that in the present embodiment the numbers of split electrodes and electrode layers, the direction of splitting, and the shape of each split electrode are not limited to those shown in FIG. 3. Reference numerals 801*a*, 801*b*, 801*c* and 801*d* denote electrode layers.

The apparatus for forming a deposited film in accordance with the present embodiment is constructed basically in the same manner as the one described in the first embodiment except the points described above, therefore its detailed description shall be omitted.

In the present embodiment, the surface of the power application electrode 306*a* facing the strip substrate consists of the first split electrodes 601, therefore, its deformation due to heat or stress caused by the deposited film formed thereon can be inhibited. In addition, since it is constructed in such a manner as to include between the first split electrodes 601 and the non-split electrode 604 a plurality of split electrode layers, that is, the second and third split electrodes 602 and 603, the heat applied per split electrode is dispersed, the deformation of the first split electrodes 601 is thereby further inhibited. Thus, the planeness of the entire surface of the power application electrode 306*a* facing the strip substrate is increased, thereby resulting in stabilization of the distance between the power application electrode 306*a* and the strip substrate. Non-uniformity in plasma due to the variation in distance between the electrodes can thereby be inhibited.

Further, since the split electrodes are small and lightweight compared with the power application electrode consisting of a single non-split plate, the maintenance, such as replacement of the split electrodes, can be performed easily.

As described above, according to the apparatus for forming a deposited film of the present embodiment, like the first embodiment, a deposited film of a desired thickness having a large area can be formed, and moreover, the improvement in maintainability enables cutting-down of the costs required to form a deposited film.

(Third Embodiment)

Figure 4:
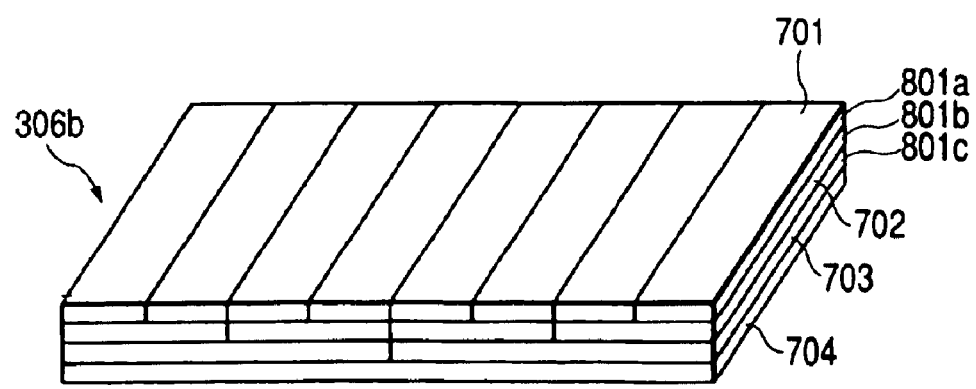
FIG. 4 is a schematic perspective view of the power application electrode of the apparatus for forming a deposited film according to the third embodiment of the present invention.
Figure 5:
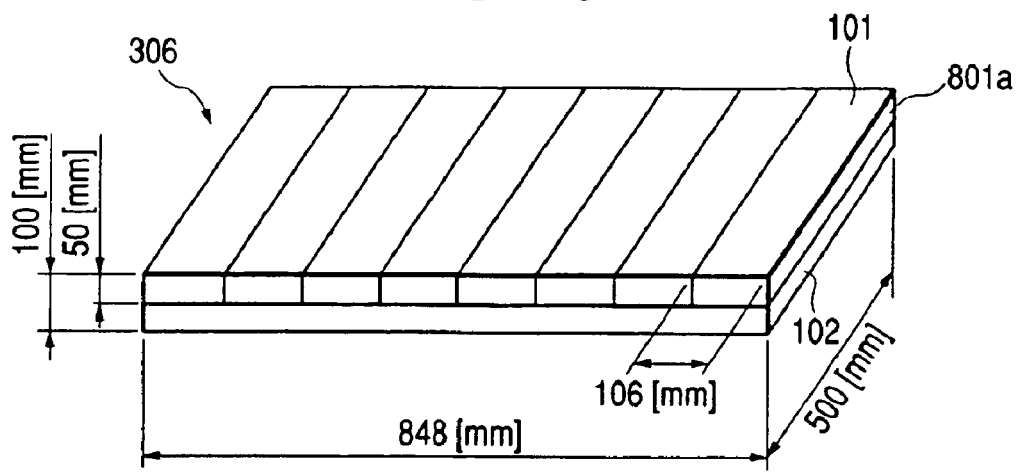
FIG. 5 is a perspective view showing the dimensions of the power application electrode used in Example 1 of the present invention.

The power application electrode 306*b* for use in an apparatus for forming a deposited film of the present embodiment has a four-layer structure including a non-split electrode 704 consisting of a single planar plate and a third, a second and a first split electrodes 703, 702 and 701 which are stacked on the planar electrode (non-split electrode) 704 one by one in this order, in which the number of the split electrodes in the layers becomes larger from the bottom layer upward, as shown in FIG. 4. The surface area of the planar electrode (non-split electrode) 704 on which each split electrode is mounted is substantially the same as the total area of the surfaces of the first split electrode 701 facing the strip substrate. Further, the total area of the surfaces of the first split electrodes 701 facing the strip substrate, the total area of the surfaces of the third split electrode 703 on which the second split electrodes 702 are mounted, and the total area of the surfaces of the second split electrodes 702 on which the first split electrodes 701 are mounted are all substantially the same. In the present embodiment, one example of the power application electrodes 306*b* has been given which includes split electrodes stacked on the non-split electrode 704 in three layers different in splitting number, in other words, which consists of: the non-split electrode 704 for holding split electrodes on its upper side surface, the first split electrodes 701 facing the strip substrate, and the second and third split electrodes 702 and 703 arranged between the non-split electrode 704 and the first split electrodes 701 in such a manner as to form layers, the area of each electrode in the layers becoming larger from the top layer downward, as shown in FIG. 4. However, it is to be understood that in the present embodiment the numbers of splits and electrode layers, the direction of splitting, and the shape of each split electrode are not limited to those shown in FIG. 4. An example of the power application electrodes 306b has been given which includes split electrode layers the split electrode number of which becomes larger from the bottom layer upward; however, it is also to be understood that the order of stacking layers is not limited to this. Reference numerals 801a, 801b, 801c and 801d denote electrode layers.

The apparatus for forming a deposited film in accordance with the present embodiment is constructed basically in the same manner as the one described in the first embodiment except the points described above; accordingly its detailed description shall be omitted.

In the present embodiment, the surface of the power application electrode 306b facing the strip substrate consists of the first split electrodes 701, therefore, its deformation due to heat or stress caused by the deposited film formed thereon can be inhibited. In addition, since it is constructed to include a plurality of split electrode layers, that is, the second and third split electrodes 702 and 703, the deformation per split electrode caused by heat is further inhibited. Furthermore, since it is constructed in such a manner that the number of splitting in the electrode layers becoming smaller from the topmost electrode layer, which is most likely to be deformed, downward, the decrease in conductivity can be inhibited, the uniform supply of electric power from the non-split electrode 704 to each of the first split electrodes 701 can thereby be realized.

Thus, the planeness of the entire surface of the power application electrode 306a facing the strip substrate is increased, thereby resulting in stabilization of the distance between the power application electrode 306b and the strip substrate. At the same time, non-uniformity in plasma can be inhibited by the uniform supply of electric power to each of the first split electrodes 701.

Further, since the split electrodes are small and lightweight compared with the power application electrode consisting of a single non-split plate, the maintenance, such as replacement of the split electrodes, can be performed easily.

As described above, according to the apparatus for forming a deposited film of the present embodiment, like the first and second embodiments, a deposited film of a desired thickness having a large area can be formed, and moreover, the improvement in maintainability enables cutting-down of the costs required to form deposited films.

While the present invention has been described in the first to third embodiments, it is to be understood that the present invention is not limited to these embodiments. In the following, examples of the first to third embodiments will be shown; however, it is also to be understood that the present invention is not limited to these examples.

First, an example of the first embodiment will be described below.

EXAMPLE 1

In this example, as an apparatus for forming a deposited film, a parallel plate type apparatus in accordance with the first embodiment, as shown in FIG. 1, was used and, as an electrode to which electric power is applied, a two-layer structure power application electrode 306 including a planar electrode (non-split electrode) 102 consisting of a single planar plate and split electrodes 101 arranged on the planar electrode (non-split electrode) 102, as shown in FIG. 2, was used.

As the power application electrode 306, the electrode of 100 mm thick including the non-split electrode 102, which is 848 mm in length, 500 mm in width and 50 mm in thickness, and eight split electrodes 101, each of which is 106 mm in length, 500 mm in width and 50 mm in thickness, arranged on the top of the non-split electrode 102 was used.

VHF electric power of 300 W and 60 MHZ was applied to the power application electrode 306, the distance between the split electrodes 101 and the strip substrate 301 was set to 20 mm, and the average temperature within the vacuum container 302 was set to 300° C. As raw material gases, $SiH_4$ and $H_2$ were used.

Figure 6:
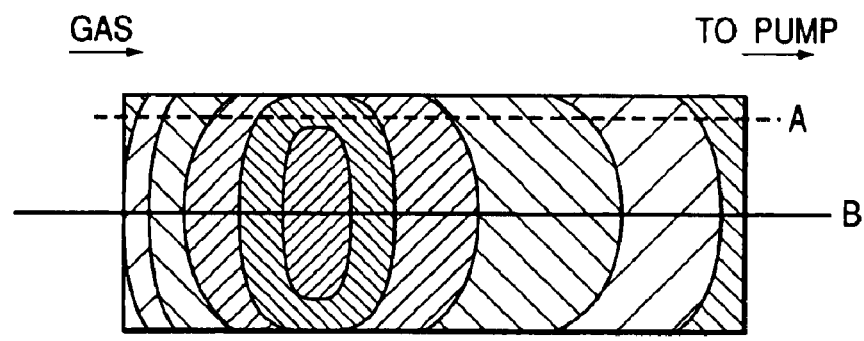
FIG. 6 is a schematic representation showing the thickness distribution of the deposited film formed on a strip substrate when utilizing the power application electrode used in Example 1 of the present invention.

FIG. 6 shows a schematic representation of the thickness distribution, in which each portion of the constant thickness of a deposited film is shown by the same line pattern (constant-thickness line), of the deposited film formed on the strip substrate 301 when utilizing the apparatus for forming a deposited film in accordance with the first embodiment of the present invention under the above conditions.

In FIG. 6, the line B is a center line parallel to the long sides of the strip substrate 301 and the broken line A is a line parallel to the line B which shows the position apart by 10% of the short side length of the strip substrate from the edge of the strip substrate 301.

Figure 7:
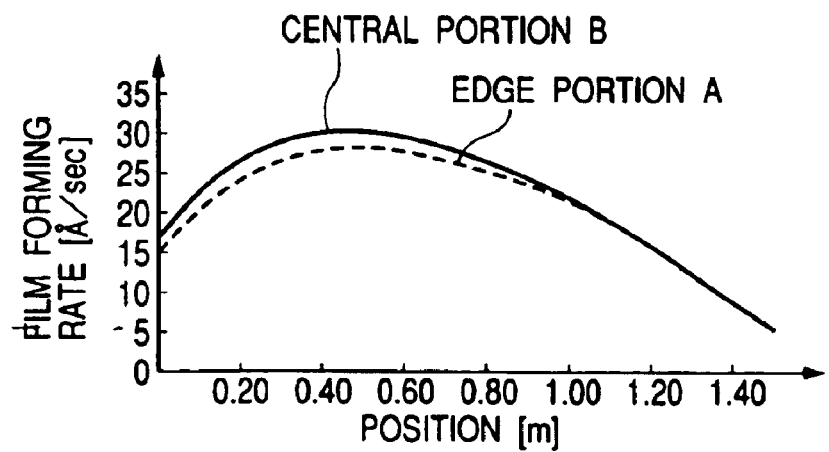
FIG. 7 is a graph showing the relationship between a film forming rate and a position on the strip substrate when utilizing the power application electrode used in Example 1 of the present invention.

FIG. 7 shows a graph exhibiting the film forming rate when the position of the raw material gas introducing portion is defined as the origin O and the position is defined as positive in the flow direction of the raw material gases.

In FIG. 7, the solid line shows the line B shown in FIG. 6, that is, the film forming rate distribution in the central portion of the strip substrate 301 and the broken line shows the broken line A shown in FIG. 6, that is, the film forming rate distribution at the position apart by 10% of the short side length of the strip substrate from the edge of the strip substrate 301. There may be various methods of evaluating the non-uniformity in film forming rate; however, in this example, the ratio of maximum value of the film forming rate at the central portion (line B) to at the edge portion (line A) was calculated. The result was as good as 5%.

EXAMPLE 2

Then an example of the second embodiment will be described below.

Figure 8:
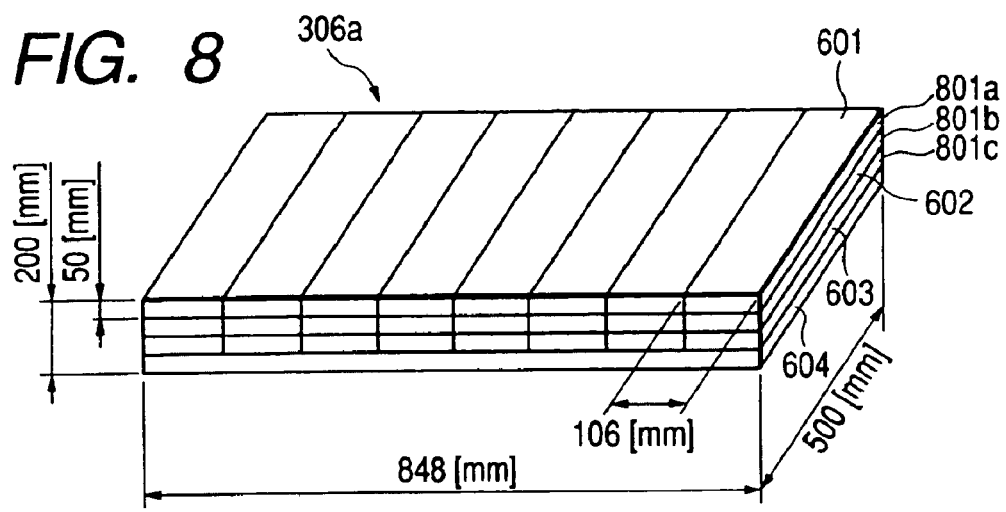
FIG. 8 is a perspective view showing the dimensions of the power application electrode used in Example 2 of the present invention.

In this example, a parallel plate type apparatus for forming a deposited film in accordance with the second embodiment was used, so as to form a deposited film on the strip substrate. Specifically, as the power application electrode 306a, this example employed the four-layer structure electrode of 200 mm thick including the planar electrode (non-split electrode) 604 being 848 mm in length, 500 mm in width and 50 mm in thickness, eight third split electrodes 603 each being 106 mm in length, 500 mm in width and 50 mm in thickness, arranged on the top of the planar electrode (non-split electrode) 604, and eight second split electrodes 602 and eight first split electrodes 601 each having the same shape as the third split electrodes 603 and stacked on the third split electrodes 603 in this order, as shown in FIG. 8.

The distance between the first split electrodes 601 and the strip substrate was 20 mm and the electric power applied to the power application electrode 306a was VHF electric power of 300 W and 60 MHZ, just like Example 1. Further, the set temperature within the vacuum container 302 and the raw material gases used were the same as in Example 1.

In order to evaluate the non-uniformity in film forming rate on the strip substrate 301 when using the apparatus for forming a deposited film as described above, the ratio of the maximum value of the film forming rate at the central portion (line B) to at the edge portion (line A) was calculated, just like Example 1. The result was 3% which was better than that of Example 1. This may be because the deformation in the power application electrode was much more absorbed by the increased number of the split electrodes, thereby increasing the planeness of the entire surface of the first split electrodes 601.

EXAMPLE 3

Then an example of the third embodiment will be described below.

Figure 9:
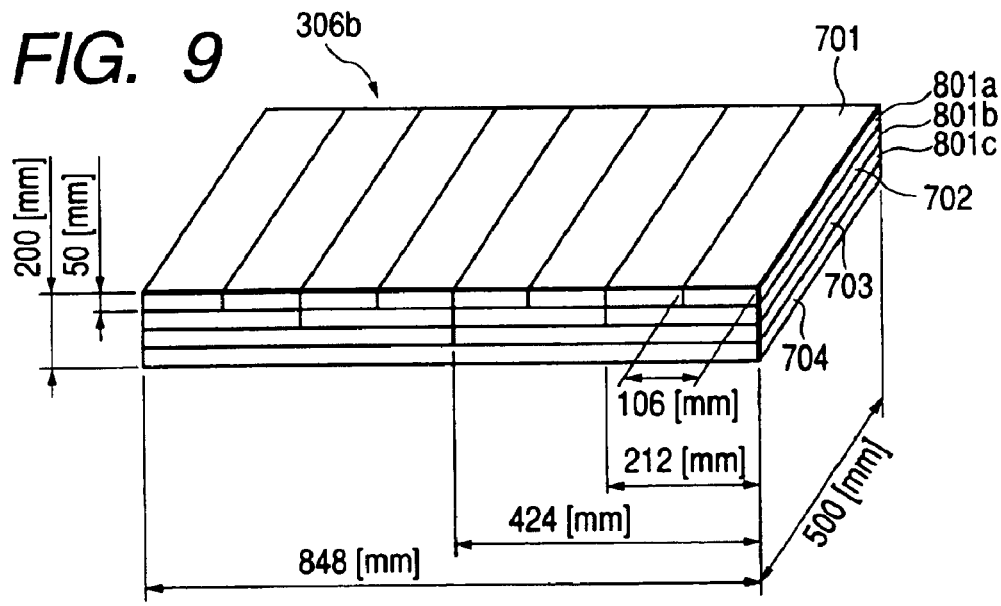
FIG. 9 is a perspective view showing the dimensions of the power application electrode used in Example 3 of the present invention.

In this example, a parallel plate type apparatus for forming a deposited film in accordance with the third embodiment was used, so as to form a deposited film on the strip substrate. Specifically, as the power application electrode 306b, this example employed the four-layer structure electrode of 200 mm thick including the planar electrode (non-split electrode) 704 being 848 mm in length, 500 mm in width and 50 mm in thickness, two third split electrodes 703 each being 424 mm in length, 500 mm in width and 50 mm in thickness, arranged on the top of the planar electrode (non-split electrode) 704, four second split electrodes 702 each being 212 mm in length, 500 mm in width and 50 mm in thickness, arranged on the third split electrodes 703, and eight first split electrodes 701 each being 106 mm in length, 500 mm in width and 50 mm in thickness, arranged on the second split electrodes 702, as shown in FIG. 9.

The distance between the first split electrodes 701 and the strip substrate was 20 mm, and the electric power applied to the power application electrode 306a was VHF electric power of 300 W and 60 MHZ, just like Examples 1 and 2. Further, the set temperature within the vacuum container 302 and the raw material gases used were the same as in Examples 1 and 2.

In order to evaluate the non-uniformity in film forming rate on the strip substrate when using the apparatus for forming a deposited film as described above, the ratio of the maximum value of the film forming rate at the central portion (line B) to at the edge portion (line A) was calculated, just like Examples 1 and 2. The result was 3% which was better than that of Example 1.

This may be because, though the number of the split electrodes was small compared with the case of Example 2 and the absorption of the deformation in the power application electrode was decreased, the conductivity was improved due to the decrease in number of the split electrodes, whereby uniform electric power could be applied.

COMPARATIVE EXAMPLE 1

Figure 10:
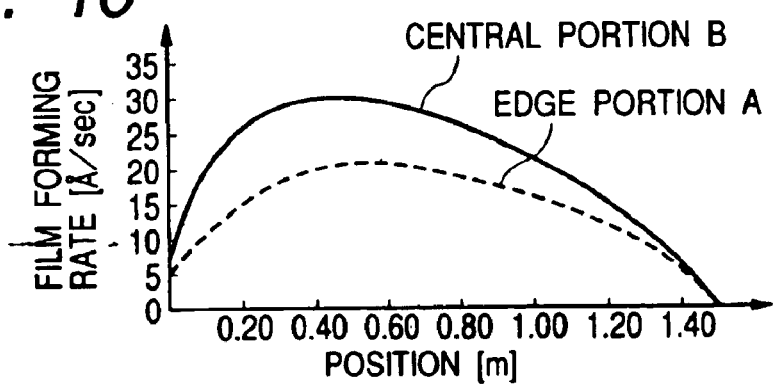
FIG. 10 is a graph showing the relationship between a film forming rate and a position on the strip substrate in an apparatus for forming a deposited film utilizing a conventional single-plate-type power application electrode.

FIG. 10 shows the film forming rate distribution when using the parallel plate type apparatus for forming a deposited film in accordance with the first embodiment, as shown in FIG. 1, and a non-split power application electrode consisting of a single planar plate being 848 mm in length, 500 mm in width and 100 mm in thickness, as a comparative example.

The solid and broken lines in FIG. 10 mean the same as those in Example 1. Specifically, the solid line shows the film forming rate distribution at the central portion B of the strip substrate and the broken line shows the film forming rate distribution at the position A apart by 10% of the short side length of the strip substrate from the edge of the strip substrate.

Deformations such as warp and bow were caused in the power application electrode due to the factors such as thermal expansion, plasma irradiation and deposited film formed on the power application electrode, and a significant difference was generated between the film forming rate distributions at the central portion and at the edge portion. The ratio of the maximum value of the film forming rate at the central portion (line B) to at the edge portion (line A) was as large as 30%.

As described above, according to the present invention, since a plurality of small-sized planar electrodes are arranged on a planar electrode in such a manner as to face a substrate, the planeness of the entire surface facing the substrate is increased, non-uniformity in plasma due to the variation in distance between the electrodes can thereby be inhibited. Further, since the small-sized planar electrodes are small and lightweight compared with the power application electrode consisting of a single plate, the maintenance, such as replacement of the small-sized electrodes, can be performed easily, thereby enabling cutting-down of the costs required to form deposited films.

What is claimed is:

1. A method of forming a deposited film comprising:
   (a) introducing a gas as a raw material for forming the deposited film into a vacuum container; and
   (b) forming the deposited film on a substrate in the vacuum container containing a pair of electrodes consisting of an electric power application electrode to which electric power is applied and the substrate on which the deposited film is to be formed by generating plasma between the substrate and the power application electrode to decompose the gas,
   wherein the power application electrode consists of a single planar electrode and a plurality of split electrodes electrically connected to the planar electrode, each of the split electrodes having an area smaller than an area of a plane of the planar electrode, and
   wherein the plurality of split electrodes are arranged on a substrate-facing side of the planar electrode so as to form at least one substantially planar electrode layer having almost the same shape as the plane of the planar electrode.

2. The method of forming a deposited film according to claim 1, wherein a part of the plurality of split electrodes are in direct contact with the planar electrode.

3. The method of forming a deposited film according to claim 1, wherein the plurality of split electrodes are arranged on a substrate-facing side of the planar electrode so as to form a plurality of substantially planar electrode layers.

4. The method of forming a deposited film according to claim 3, wherein each area of the split electrodes are all the same.

5. The method of forming a deposited film according to claim 3, wherein each area of the split electrodes differs depending on the electrode layers.

6. The method of forming a deposited film according to claim 3, wherein each area of the split electrodes forming each electrode layer become larger in the electrode layer near the planer electrode than in the electrode layer far from the planar electrode.

* * * * *